United States Patent [19]
Durig et al.

[11] Patent Number: 5,237,493
[45] Date of Patent: Aug. 17, 1993

[54] CURRENT-TO-VOLTAGE CONVERTER WITH LOW NOISE, WIDE BANDWIDTH AND HIGH DYNAMIC RANGE

[75] Inventors: Urs T. Durig, Ruschlikon; Bruno Michel, Gattikon, both of Switzerland

[73] Assignee: International Business Machines Corporation, Armonk, N.Y.

[21] Appl. No.: 773,053

[22] Filed: Oct. 8, 1991

[30] Foreign Application Priority Data

Oct. 24, 1990 [EP] European Pat. Off. ............ 90810818

[51] Int. Cl.[5] .............................................. H02M 7/00
[52] U.S. Cl. ..................................... 363/73; 324/120; 330/260; 330/288; 330/297
[58] Field of Search .......................... 363/73; 324/120; 330/288, 291, 297, 260, 282

[56] References Cited

FOREIGN PATENT DOCUMENTS 3144003 11/1981 Fed. Rep. of Germany .
2032191 4/1980 United Kingdom .

OTHER PUBLICATIONS

Electric Design news, vol. 31, No. 4, Feb. 1986, pp. 225-228, "Use a G Decade Box to Calibrate Picoammeters".

Nuclear Instruments and Method in Physics Research/-Section A., vol. A253, No. 3, Jan. 15, 1987, pp. 427-433, "Integrated Low Noise Amplifies in CMOS Technology".

Nuclear Instruments & Methods, Vol. 25, No. 2, Jan. 1964, pp. 317-327, "Electrometer Circuit Design for Extended Band Widths".

F. J. Sigworth, "Single Channel Recording" 1983, pp. 3-35, Sakman & Neher Ed.

Primary Examiner—Emanuel T. Voeltz
Attorney, Agent, or Firm—Charles W. Peterson, Jr.

[57] ABSTRACT

The design of a current-to-voltage converter with a uniform transfer function in its feedback loop (12) is proposed. It employs a very large, double-shielded measuring resistance (13) and a two-stage setup to perform a fully linear I/V conversion with a conversion factor of $10^{10}$ V/A and a bandwidth of 1 MHz. With the low noise level attained, and with the bandwidth and conversion factor mentioned, it will be possible to monitor events involving as few as 300 electrons. The current-to-voltage converter comprises a differential input amplifier (8), a current source (11) for supplying said differential amplifier (8), at least one operational amplifier (10, 14), and a high-valued measuring resistance (13) the voltage drop across which is being taken as a measure of the current to be detected. The measuring resistance (13) is arranged in a feedback loop (12) associated with said differential amplifier (8). The measuring resistance (13) is double-shielded from the remainder of the current/voltage converter circuitry through its arrangement inside a cylindrical capacitor C which acts as a first shield, and which is in turn connected to a casing (15, 25) surrounding the differential amplifier (8) and the feedback loop (12) and which constitutes a second shield.

13 Claims, 5 Drawing Sheets

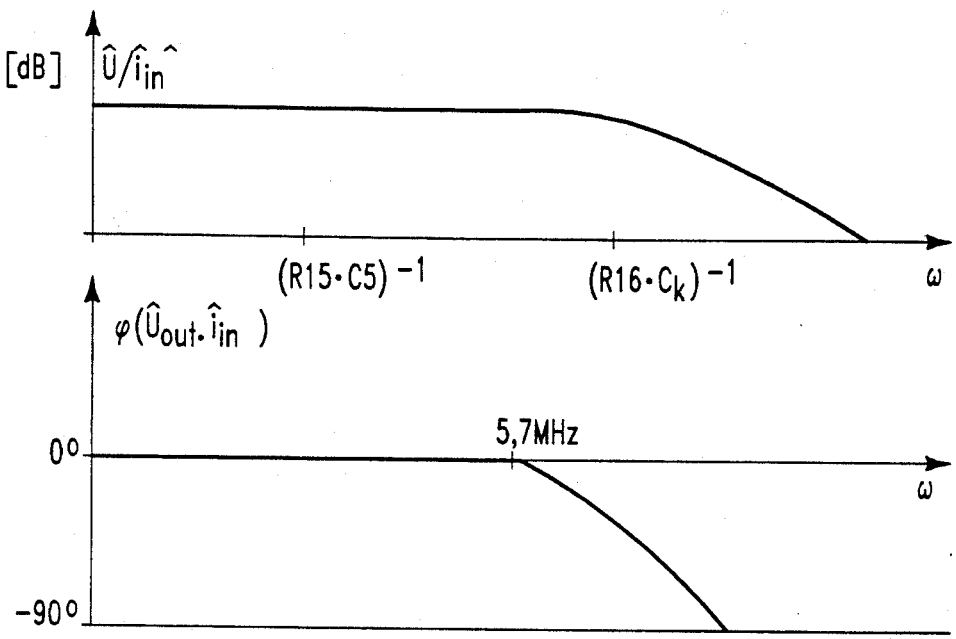
FIG. 8
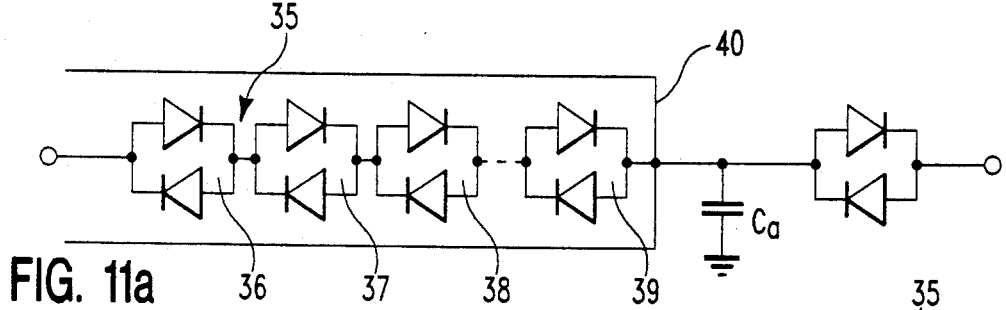
FIG. 11a
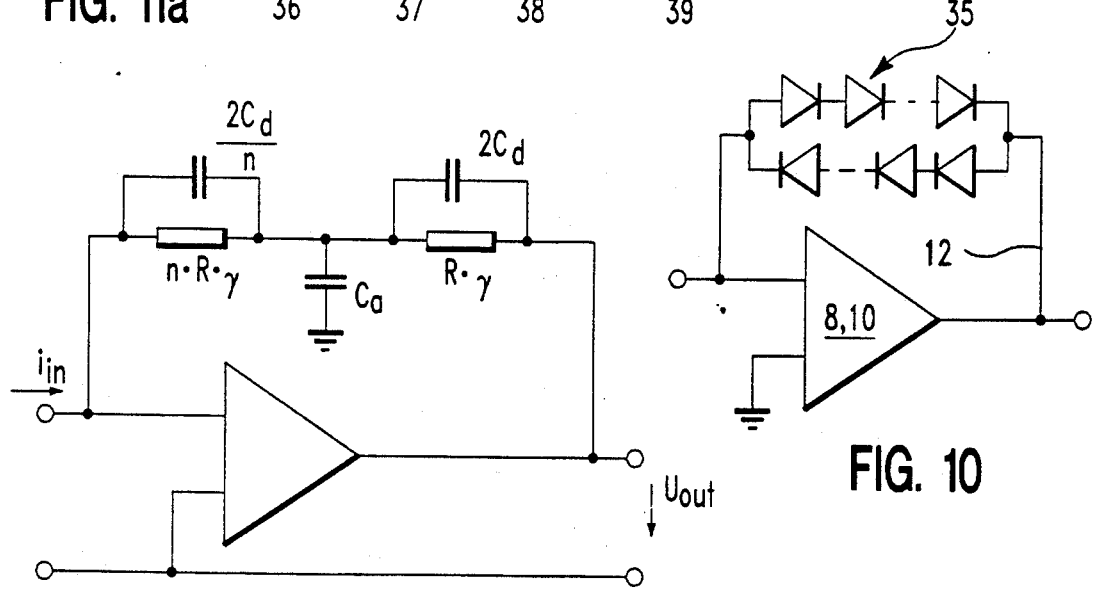
FIG. 11b
FIG. 10

CURRENT-TO-VOLTAGE CONVERTER WITH LOW NOISE, WIDE BANDWIDTH AND HIGH DYNAMIC RANGE

DESCRIPTION

The invention relates to a low-noise, wide-bandwidth and high-dynamic-range current-to-voltage converter for use in applications where small electric currents are to be measured within a very short period of time. One illustrative application would be in the field of scanning tunneling microscopy where the detection of as few as 300 electrons during a period of one microsecond, with continuous sampling, may be required. Generally, the invention can be used in any high-impedance analytical circuit as, e.g., in the emerging field of molecular electronics. Novel storage techniques involving the detection of trapped charges on nanometer scale will be heavily dependent on the current measurement technique of the present invention.

The measurement of very small currents has been the subject of many publications for decades. The standard way to measure small currents is to monitor the voltage drop across a large resistor, with the potential at the probe set by a reference voltage. The problem with such a configuration is that the potential at the probe is not exactly equal to the reference voltage but has a current-dependent error. Accordingly, if the resistor is made large to give high sensitivity, the voltage error also becomes large.

However, the most important disadvantages of the prior art current measurement instruments are their high noise level that could influence the correctness of the measurements taken, and the relatively narrow bandwidth. Above all, the main disadvantage of the prior art devices resides in the non-linear transfer function in their feedback loop. Most applications of low-current measurements known in the prior art are to be found in connection with studies carried out at biological cells. In particular, the so-called extracellular patch clamp method which was developed to allow the detection of currents in single ionic channels in biological membranes, is of special interest. In this technique, a small glass pipette is pressed against the cell membrane, forming an electrical seal with a resistance of the order of 10 G$\Omega$. The high resistance of this seal ensures that most of the current originating in a small patch of membrane flows into the pipette and from there into current measurement circuitry.

The pipette current is typically measured as the voltage drop across a high-valued resistor, and the voltage is then amplified by an operational amplifier. The capacitance inevitably shunting the measuring resistor affects the frequency response of the current/voltage converter. Also, at higher frequencies, the input capacitance of the operational amplifier is responsible for background noise that is imposed by the feedback loop on the pipette and on the input of the amplifier.

An example of the prior art is the chapter "Electronic Design of the Patch Clamp" by F. J. Sigworth in the book "Single-Channel Recording", Burt Sakman & Erwin Neher ed., Plenum Press, New York and London 1983, pp. 3-35. This reference proposes a solution to the problems mentioned above: The voltage at the probe is measured directly with continuous adjustment of a second voltage source to bring the probe voltage to the correct value. The voltage adjustment may be automatic through an operational amplifier.

O. P. Hamill et al., "Improved Patch-Clamp Techniques for High-Resolution Current Recording from Cells and Cell-Free Membrane Patches", Pflüger's Archiv (1981) 391: 85-100, discloses a sketchy circuit diagram of a current-to-voltage converter wherein the current is measured as the voltage drop across a high-valued resistor and wherein provisions are made to suppress the noise through reduction of the input impedance of the operational amplifier as well as by observing extreme cleanliness during pipette preparation and providing the pipette with a hydrophobic coating to prevent the formation of a water film and to reduce the pipette capacitance.

B. Astor et al., "Strommessung im pA-Bereich bis 250 kHz", Elektronik 1, 10.1.1986, pp. 35-38, describe measurement circuitry of the type used in cell membrane investigations which permits the measurement of currents down to about 5 pA at frequencies up to 5 kHz (for uniform frquency response), with input resistances of the order of 10 G$\Omega$. The input circuit of the (otherwise not detailed) current/voltage converter is designed as a mixed ohmic-capacitive voltage divider.

A. Van der Ziel, "Noise in Solid State Devices and Lasers", Proc. IEEE 58 (1970) pp. 1178-1206, gives an overview of the various sources of noise and of ways to avoid or overcome undesired noise in circuits. Neither this nor any other known prior art reference deals with the shielding of the measuring resistor or with the special care required in the design of the feedback loop in low-current measuring.

In accordance with the present invention, a novel design of a current-to-voltage converter with superior bandwidth and signal-to-noise ratio is proposed. It is intended to solve the problem of the non-uniform transfer function in the feedback loop of current-to-voltage converters (I/V converters) with a very large, double-shielded measuring resistance. The proposed I/V converter uses a two-stage setup to perform a fully linear I/V conversion with a conversion factor of $10^{10}$ V/A and a bandwidth of 1 MHz. With the low noise level attained, and with the bandwidth and conversion factor mentioned, it will be possible to monitor events involving as few as 300 electrons.

Yet the proposed design may also be operated with a smaller conversion factor but greater bandwidth. And with improved components, or by integration of most components, higher values for the conversion factor and bandwidth appear possible. The dynamic range of the I/V converter may be as high as seven decades when the measuring resistance in the feedback path is a non-linear device, such as a diode, or a transistor. The non-linear device has likewise to be double-shielded to guarantee a uniform transfer function.

Therefore, the current-to-voltage converter of the present invention comprises a differential input amplifier, a current source for supplying said differential amplifier, at least one operational amplifier, and a high-valued measuring resistance the voltage drop across which is being taken as a measure of the current to be detected; the converter being characterized in that said measuring resistance is arranged in a feedback loop associated with said differential amplifier, that said measuring resistance is double-shielded from the remainder of the current/voltage converter circuitry through its arrangement inside a first casing constituting a first shield which is in turn connected to a second casing which surrounds said differential amplifier and said feedback loop, and which constitutes a second shield.

As concerns the physical size of the proposed I/V converter, many units, each composed of operational amplifiers and a double-shielded measuring resistance, may be integrated into a single semiconductor chip. The I/V converter is the crucial element that decides on the speed of data transfer into and out of mass storage, where the storage devices may be based on the technology of the well-known scanning tunneling microscope (STM), i.e. STM's with a large number of tips. With a data transfer rate of the order of ten Megabits per second, an instrument with 1000 tips would be able to transfer about 10 Gigabits per second.

BRIEF DESCRIPTION OF THE DRAWINGS

Details of preferred embodiments of the invention will now be described by way of example and with reference to the accompanying drawings in which:

FIG. 8 is graph showing the transfer characteristics of the measuring resistor, namely attenuation (a) and phase shift (b);

FIG. 10 shows an alternative arrangement for the feedback loop of FIGS. 4 and 9, involving a first version of a diode chain;

FIG. 11 shows a second version of a diode chain for the feedback loop (a), and its equivalent circuit (b).

TECHNICAL DESCRIPTION OF THE PREFERRED EMBODIMENT

In converting a small current into a voltage drop across a large measuring resistance, to yield a useful signal, the voltage drop must be considerably larger than the noise inherent in the conversion circuitry. The main source of noise is the thermal noise in the resistor given by $$I_n = (4kT\Delta f/R)^{0.5} \quad [1]$$

where k is the Boltzmann constant, T the absolute temperature of the resistor R, and $\Delta f$ is the noise bandwidth. It is immediately apparent that the measurement of small currents requires resistances with large ohmic values.

In any real circuit there will be shunt capacitances ($C_i$) present stemming from transistor junctions, conductors, current source, etc. Even if all those capacitances add up to only a few picofarad, together with the large resistance they will severely reduce the bandwidth of the measuring circuitry.

Figure 1:
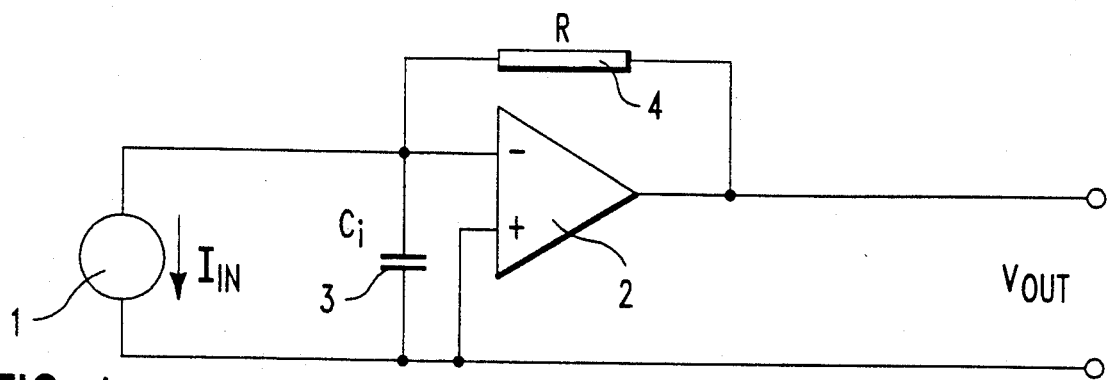
FIG. 1 shows a basic current/voltage converter circuit with feedback loop.

Thus, for obvious reasons, low noise and wide bandwidth are contradictory requirements in low-current measuring. To soften this contradiction, it has been proposed to use a second amplifier with an inverse frequency response. But the most common approach is the current feedback technique where the measuring resistance is placed in the feedback loop of an inverting amplifier having a gain of $A(\omega)$. The basic configuration of a current measurement circuit having a feedback loop is shown in FIG. 1.

The current source 1 is connected to the inputs of an operational amplifier 2. The parasitic capacitances appearing at the input side of the circuit are represented by the capacitor 3. The measuring resistor 4 is connected between the output terminal of the operational amplifier 2 and the current source 1. The bandwidth $\omega_{max}$ of this I/V converter is given by the condition:

$$\omega_{max} \frac{RC_i}{A_{\omega\,max}} = 1. \quad [2]$$

With $R=10$ G$\Omega$, $C_i=5$ pF and $\omega_{max}=1$ MHz, the gain of the amplifier at 1 MHz must exceed 110 dB, which is equivalent to a gain-bandwidth product of 300 GHz. Obviously, a single operational amplifier cannot provide that gain.

Two approaches to overcome this problem are known to those skilled in the art. In the first approach, the $1/\omega^2$ term (arising from the $1/\omega$ gain characteristics of the operational amplifier and the $1/\omega$ characteristics of the RC network rolloff of the conversion gain) is compensated by a subsequent amplifier with reverse frequency characteristics. The scheme heavily sacrifices, however, on signal-to-noise performance.

In a second approach, an operational amplifier in open-loop configuration is combined with a high input impedance amplifier stage that provides additional loop gain. This scheme still suffers from a stability problem arising from the $1/\omega$ amplifier gain characteristics which causes a vanishing phase margin for the closed loop. As a result, the frequency response of the converter exhibits a resonance at $\omega_{max}$. Any additional phase shift introduced, e.g., by uncontrolled stray capacitances in the feedback circuit, or by the inductive source impedance, will render the converter unstable.

The only proper solution to the problem is to use a loop amplifier with sufficient voltage gain and a flat frequency response up to $\omega_{max}$. However, a major difficulty with the feedback system arises from a shunt capacitance $C_f$ (7 in FIG. 2) associated with the large resistor in the feedback path. This shunt capacitance dominates the time constant for real resistors with a resistance larger than about $10^8$ $\omega$. The addition of a low-pass filter comprising a resistor 5 and a capacitor 6 in the feedback loop, as shown in FIG. 2, with the same time constant as the high-pass filter consisting of measuring resistor 4 and shunt capacitance 7 ($R_1C_1=RC_1$), would correct the network impedance to $R+R_1$ with no imaginary component.

It would be possible to decrease the impedance of the $R_1C_1$ low-pass filter by using active components. Shielding between $R_1$ and R would then become less important, but still, crosstalk between this line and the I-V converter input must be avoided.

Figure 2:
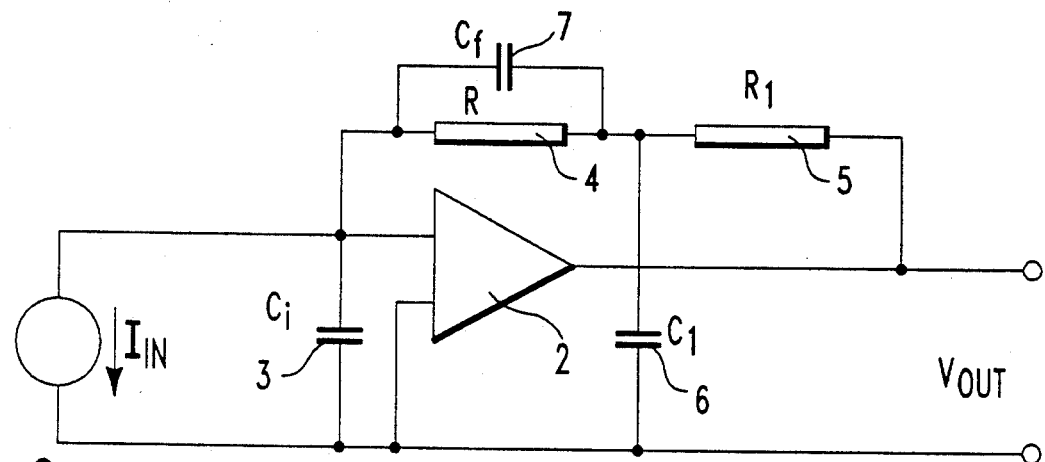
FIG. 2 shows the circuit of FIG. 1 with a low-pass filter.

At very high frequencies, the compensation circuit of FIG. 2 becomes problematic owing to the high impedance ($10^6\omega$) of the connection between resistor 5 and the measuring resistor 4. The value of resistor 5 can be reduced while increasing the capacitance of capacitor 6, but this is limited since capacitors with good high-frequency properties (ceramic) are available only for values up to several nanofarad. Thus, because of the high impedance of the feedback loop, any point along measuring resistor 4 and resistor 5 is subject to pickup of electromagnetic radiation and capacitive coupling to other lines.

The obvious solution to this problem would be the shielding of measuring resistor 4 and the components 5 and 6 of the low-pass filter by adding a grounded casing. However, this would introduce a disturbing, though small, capacitive coupling to ground. The equivalent circuit for such a network shows that its transfer function will be very complex, having an infinite number of poles. Hence, compensation by a subsequent stage will only be possible approximately.

Figure 3:
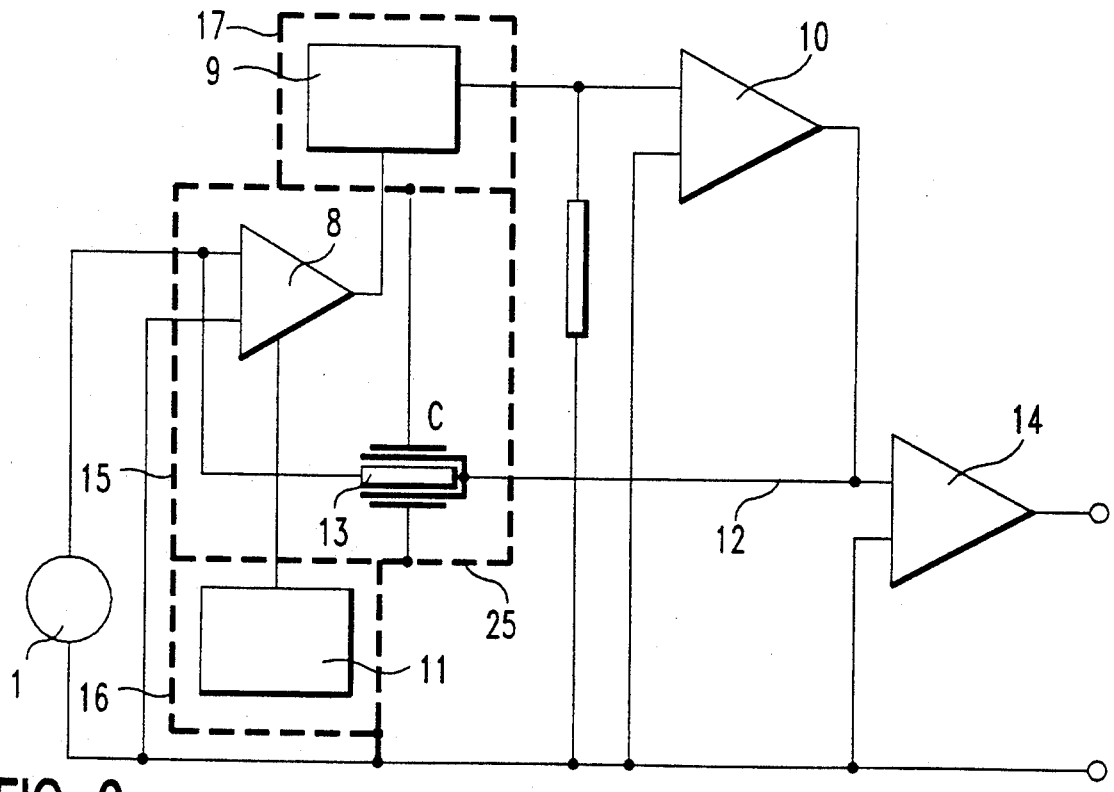
FIG. 3 is a block diagram of the current/voltage converter of the invention.

The assessment of these problems and the consideration of possible solutions has led to a new design of an I/V converter in accordance with the invention, a first preferred embodiment of which is shown in FIG. 3. This new design comprises a cascode FET differential amplifier 8, a current mirror amplifier 9, a main amplifier 10, a current source 11, a feedback loop 12 with the shielded measuring resistor 13, and a low-pass line driver 14 at the output. In designing the new I/V converter, the following points have received special attention:

The transfer function of the feedback loop 12 is made uniform by means of double-shielding of the measuring resistance 13.

The preamplifier 8 is effectively sealed from the output by a double casing with no leak where the measuring resistor 13 is penetrating the casing.

A high gain-bandwith product and a low output impedance of the preamplifier 8 are achieved with an amplifying current mirror 9 which adjusts the potential of the output line to ±1 mV so that the gain of the next amplifier stage can be as large as 1000.

The flat frequency response of the feedback amplifier can be maintained up to the maximum operating frequency.

The circuit is stable for any phase between −90° and +90° of the source impedance.

Figure 4:
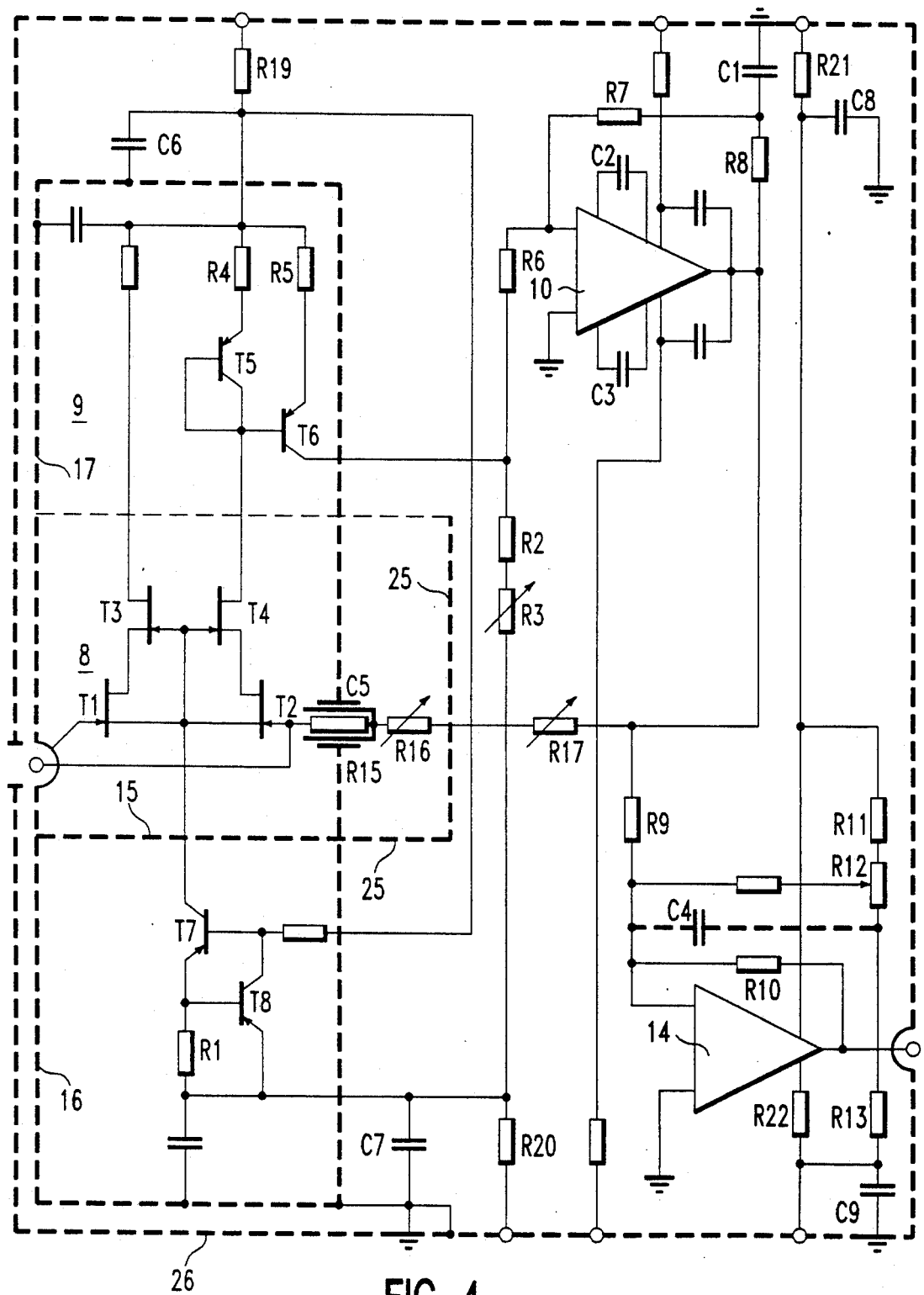
FIG. 4 is a detailed circuit diagram of a first embodiment of the current/voltage converter of FIG. 3.

A more detailed circuit diagram of a first embodiment of the the I/V converter of the invention is shown in FIG. 4. The main loop of the I/V converter is formed by the differential preamplifier 8 composed of field-effect transistors T1 through T4, current mirror amplifier 9 comprising transistors T5 and T6, and main operational amplifier 10.

Input differential amplifier 8 is a very important element in the I/V converter of the invention since it determines the signal-to-noise ratio of the converter and the leakage current. In accordance with the invention, differential amplifier 8 uses a cascode type configuration in either path. This allows a wide-bandwidth amplification because the effect of the source/gate shunt capacitances to reduce the bandwidth, is avoided. These source/gate capacitances are kept low by a high drain/gate voltage drop (3–4 V) on either transistor of the cascode circuit.

The input signal line as well as the feedback loop 12 are connected to the gate of transistor T2, while the gate of transistor T1 is connected to the shield and, hence, to ground. The feedback loop causes the input of transistor T2 to be close to zero, this being a virtual mass. As is known from the prior art, the gate of transistor T2 could also be connected to a reference potential. The current through transistors T1 and T2 is maintained invariant by constant current source 11 which comprises the transistors T7 and T8, the collector of transistor T7 being in series connection with the source electrodes of transistors T1 and T2. Transistor T8 may also be replaced by a Zener diode, but the transistor is preferred as it allows the base potential to be independent of the power supply voltage. The imposed current is adjusted (to 1 mA) by a resistor R1 in the emitter circuit of transistor T7.

The current mirror 9 serves two purposes: First, it is provided to match the load impedance (resistors R2 and R3) to the input impedance of the wideband operational amplifier 10, while preserving the voltage gain (at about 50); second, it serves to adjust the common mode potential for operational amplifier 10 to 0 V, where the operation of the amplifier is optimum. The output current $I_a$ and the output impedance $Z_a$ of current mirror 9 depend on the relation of the emitter resistances R4 and R5 of transistors T5 and T6 and are, respectively:

$$I_a = I_e \frac{R4}{R5} \; ; \; Z_a = Z_e \frac{R4}{R5} \,. \qquad [3]$$

In the embodiment of FIG. 4, the output current of current mirror 9 is transformed from 0.5 mA to 5 mA by appropriately choosing resistor R5 smaller than resistor R4.

The conversion of the output current of current mirror 9 into a voltage is performed over the load resistors R2 and R3. The voltage drop over resistors R2 and R3 is then amplified by operational amplifier 10 which has a gain of 1000. A resistor R6 serves to protect the input of operational amplifier 10 from overload. The shunt capacitance of the resistor R7 in the feedback loop of amplifier 10 is compensated by a low-pass filter consisting of a resistor R8 and a capacitor C1 to ensure constant amplification up to a frequency of 10 MHz. Bandwidth and stability of amplifier 10 are optimized by capacitors C2 and C3.

The output signal of operational amplifier 10 is used to drive buffer amplifier 14. When amplifier 14 is operated as a low-pass, which is the preferred mode of operation, a shunt capacitor C4 may be placed in parallel with feedback resistor R10. Also, an offset adjustment may be added by means of a network comprising resistors R11 through R14. The total capacitive load at the output of amplifier 10 should not exceed about 100 pF. Buffer amplifier 14 effectively prevents phase shifts of the output signal of operational amplifier 10 and instabilities of the I/V converter that may be caused by long connection lines.

The ohmic measuring resistor R15 is connected in the main feedback loop 12 between the input terminal of differential amplifier 8 and the output of main operational amplifier 10. Measuring resistor R15 may have between 1 and 100 GΩ. For impedance differences of $10^9$ Ω and up, shielding is an absolute requirement to prevent crosstalk from the output to the input of the converter. Therefore, differential amplifier 8 is shielded by means of a first metal casing 15 which encloses transistors T1 ... T4, and which is provided with feedthrough devices to permit the connection of amplifier 8 to constant current source 11 as well as to current mirror 9. These circuits are likewise shielded independently by second and third casings 16 and 17, respectively.

Figure 5:
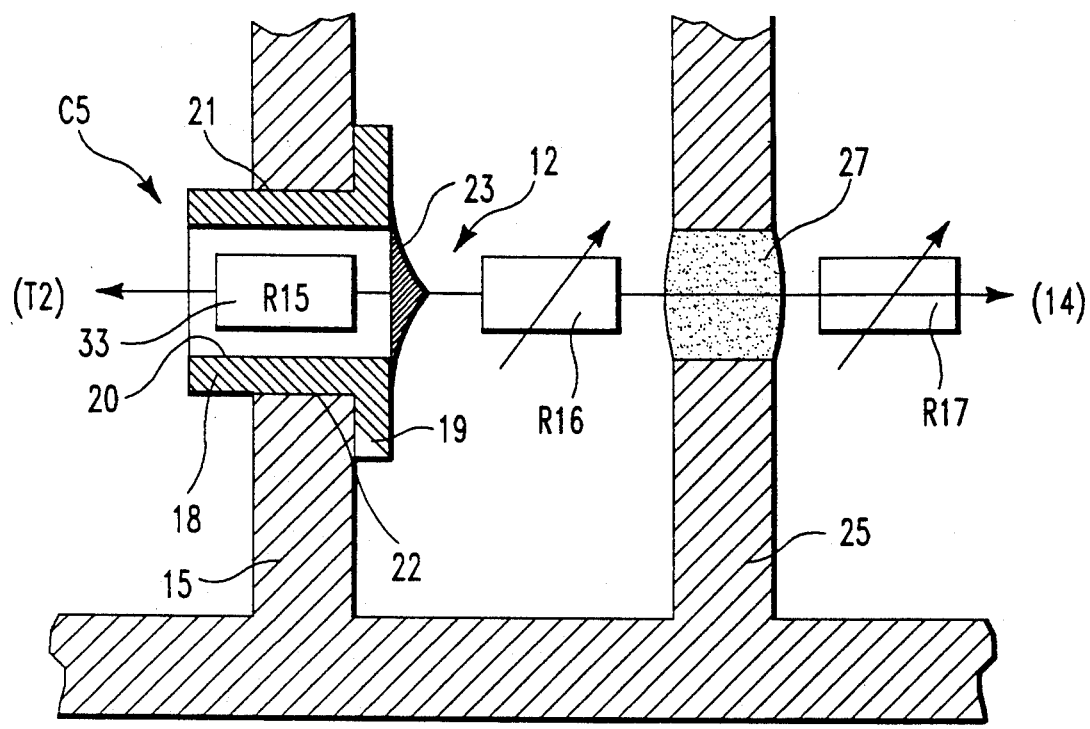
FIG. 5 shows a double-shielded measuring resistor.

The transfer function of measuring resistor R15 is made uniform by means of a low-pass filter comprising resistors R16, R17 and a capacitor C5. In order to prevent capacitive coupling of measuring resistor R15 to ground,—which is most critical in the middle of the resistor body,—capacitor C5 is designed as a tube, and resistor R15 is arranged inside said tube as shown in FIG. 5. In fact, capacitor C5 consists of a dielectric sleeve 18 having a circular collar 19 and a metallic, tube-shaped inner wall 20 and a likewise tube-shaped outer wall 21, walls 20 and 21, of course, forming the plates of capacitor C5. Sleeve 18 sits tightly inside an opening 22 in casing 15 such that collar 19 rests on the outside of casing 15. The dielectric constant of the material of sleeve 18 and its dimensions are chosen such that capacitor C5 has a capacitance between 1 and 10 nF, preferably of about 4 nF, for example.

Resistor R15 is enclosed within capacitor C5, having one of its terminals soldered into a head portion 23 capping the entirety of collar 19 of capacitor C5 and being electrically connected to inner wall 20 thereof. Thus, the inner plate of capacitor C5 and, hence, the first shield of measuring resistor R15 is connected to the potential beyond the low-pass filter, while the second shield, namely the other plate of capacitor C5 is connected to casing 15 and, hence, to ground. Head portion 23 is connected via line 24 to resistor R16 which is provided as a potentiometer to permit coarse adjustment. High-impedance line 24 and resistor R16 are encapsulated within a casing 25. The only side effect of the arrangement described above is a minor increase of the parallel stray capacitance. This can easily be compensated by adjusting potentiometer R16.

Figure 6:
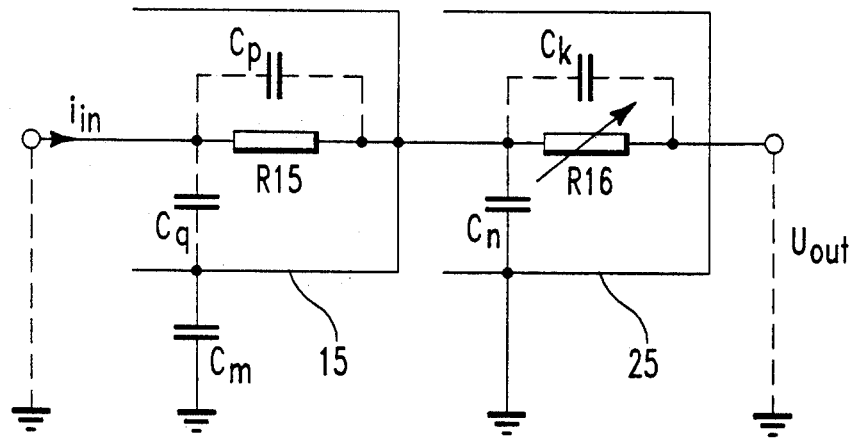
FIG. 6 is a circuit diagram of the measuring resistance of FIG. 5 and its associated capacitances.

It may be useful at this point to briefly look at the transfer characteristics of the double-shielded measuring resistor R15 and its associated tube capacitor C5. FIG. 6 shows a circuit diagram of this resistor with the various stray capacitances caused by casings 15 and 25. $C_p$ is the capacitance along resistor R15; $C_q$ is the capacitance of resistor R15 with respect to the inner metallization 20 of tube capacitor C5. $C_m$ is the capacitance of said inner metallization 20 with respect to casing 15, mainly attributable to tube capacitor C5. $C_k$ is the parallel capacitance over potentiometer R16, and $C_n$ is the capacitance of potentiometer R16 with respect to casing 25.

Figure 7:
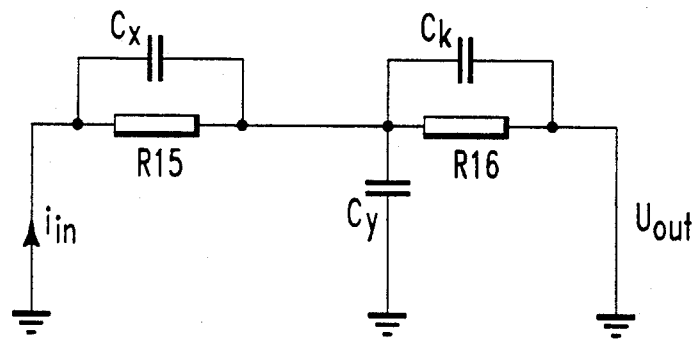
FIG. 7 is the equivalent circuit for the circuitry of FIG. 6.

FIG. 7 shows the equivalent circuit for the circuitry of FIG. 6, where $C_x = C_p + C_q$, and $C_y = C_m + C_n$. With this, one obtains the transfer characteristics of the measuring resistor R15 as:

$$\frac{U_{out}}{I_{in}} = -(R15 + R_k)\frac{\left(1 + j\omega\frac{R15 \cdot R_k}{(R15 + R_k)}(C_x + C_y + C_k)\right)}{(1 + j\omega R15 \cdot C_x)(1 + j\omega R16 \cdot C_k)}. \quad [4]$$

The condition for adjustment is:

$$\frac{R15 \cdot R16}{(R15 + R16)}(C_x + C_y + C_k) = R \cdot C_x \quad [5]$$

$$R16(C_y + C_k) = R15 \cdot C_x \quad [6]$$

The bandwidth is determined by the $R16 \cdot C_k$ time constant, and if that is to be 1 MHz, for example, with a parallel capacitance $C_k \approx 0.2$ pF:

$$R16 = \frac{10^{12}}{2\pi \, 10^6 \, 0.2} \approx 800 \text{ k}\Omega \quad [7]$$

Further, with measuring resistor $R15 = 10^{10} \, \Omega$ and a capacitance $C_x \approx 0.35$ pF, $$C_y = \frac{R15 \cdot C_x - R16 \cdot C_k}{R16} \approx 4.4 \text{ nF}. \quad [8]$$

The value of $C_y \approx 4.4$ nF is mainly concentrated in the tube capacitor C5, and this is a value that is commercially available.

The transfer characteristic of the feedback loop 12 with measuring resistor R15 and capacitor C5 for the case of full compensation is depicted in FIG. 8. The upper curve (a) in FIG. 8 shows the onset of the attenuation at $\omega = 6.25$ MHz, the lower curve (b) shows that the phase is not shifted up to a frequency of $\omega \approx 5.7$ MHz.

In view of the fact that high-impedance line 24,—which is connected to measuring resistor R15,—and potentiometer R16 are very sensitive to ambient radiation, these elements of the feedback loop are shielded, as already mentioned, by a fourth casing 25 which is firmly attached to casing 15 of differential amplifier 8. Casings 15, 16, 17 and 25 are commonly connected to ground. A fifth casing 26 which houses the entire I/V converter, is also connected to ground. Casing 25 is provided with a feedthrough 27 to permit potentiometer R16 to be connected to a fine-adjustment potentiometer R17. The latter is in turn connected to resistor R9 at the input of buffer amplifier 14.

Reverting to FIG. 4, several low-pass filters, such as those respectively comprising a resistor R19 and a capacitor C6, R20 and C7, R21 and C8, R22 and C9, etc. are provided to prevent any high-frequency ringing from developing within the converter.

Figure 9:
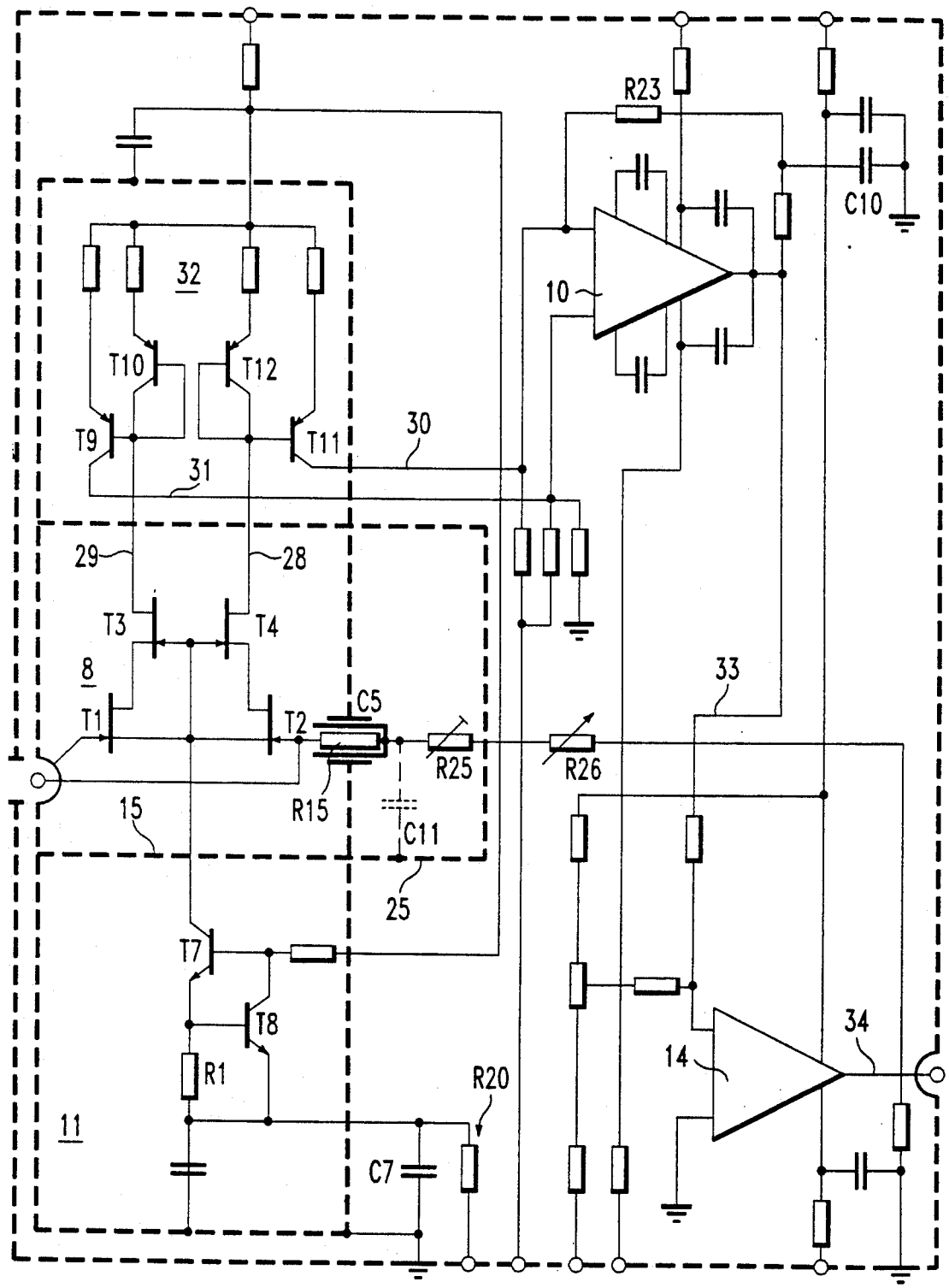
FIG. 9 is a detailed circuit diagram of a second embodiment of the converter of FIG. 3.

FIG. 9 shows a second preferred embodiment of the I/V converter in accordance with the present invention. The general concept is the same as used in the first embodiment of FIG. 4 and, therefore, some of the components retain their reference numbers. Yet there are certain differences which will hereafter be described. The first apparent difference resides in the fact that in the circuit of FIG. 9, both output lines 28, 29 of differential amplifier 8 are connected to one of a pair of current mirror circuits which, respectively, comprise the transistor pairs T9/T10 and T11/T12. Therefore, resistor R1 of constant current source 11 is chosen such that an imposed current of 5 mA is supplied. This double-path arrangement aids in reducing the effect of the ripple of the power supply voltage on the signal being processed.

The output lines 30 and 31 of current mirror pair 32 are connected, respectively, to the positive and negative input terminals of operational amplifier 10 which is now operated as a current amplifier. The shunt capacitance of feedback resistor R23 is compensated by a low-pass filter comprising a resistor R24 and a capacitor C10. The output signal of operational amplifier 10 on line 33 is supplied to the input of operational amplifier 14. The output 34 of the latter is connected to the feedback loop including measuring resistor R15, tube capacitor C5, a trimmer potentiometer R25 for coarse adjustment, and a potentiometer R26 for fine adjustment.

It is to be noted that the same measures for shielding the individual components apply as discussed in connection with FIG. 4. Also, measuring resistor R15, having a resistance in the 1 to 10 GΩ range, is to be arranged inside tube capacitor C5 and enclosed within the respective casings 15 and 25. Perhaps, an additional capacitor C11 may be required in parallel with tube capacitor C5 in order to bring the effectice capacitance up to about 4 nF.

While in the circuits so far discussed, the measuring resistor R15 of the feedback loop 12 was assumed to be strictly ohmic, it is also possible to introduce a non-linear feedback scheme featuring a logarithmic characteristic, for example. One way to do this is to replace ohmic resistor R15 by a single diode or, better, by a chain 35 of diodes in antiparallel connection as shown in FIG. 10. The diode characteristic for a single diode of the chain of FIG. 10 is given by:

$$i_{x1} = I_s(T)\left(e^{\frac{u_{x1}}{m \cdot U_T}} - 1\right); \qquad [9]$$

$$U_T = \frac{kT}{e_0}; 1 \leq m \leq 2,$$

wherein $i_x$ is the current through any diode of one of the two branches of the diode chain, $u_x$ is the voltage drop across each diode, k is the Boltzman constant and T the absolute temperature, and m is a phenomenological constant of the order 1. With an equal number of diodes in each of the two branches of diode chain 35, one obtains:

$$i_x = 2I_s \cdot \sinh\left(\frac{U_x}{n \cdot m \cdot U_T}\right); \qquad [10]$$

$$u_x = -n \cdot m \cdot U_T \cdot \text{arcsinh}\left(\frac{i_x}{2I_s}\right),$$

with n being the number of diodes in each branch. Obviously, the greater the number of diodes, the better is the suppresion of the stray capacitances. Experiments have shown that the best arrangement of the non-linear feedback loop is as a chain 35 of pairs 36 ... 39 of diodes in antiparallel connection. FIG. 11 shows this arrangement (a) and its equivalent circuit (b). High-frequency considerations require shielding the diode chain, but a shield 40 would, of course, increase the capacitance. The transfer characteristics of this feedback loop is given by:

$$\frac{u_{out}}{i_{in}} = -(n+1)R \cdot \gamma \frac{\left(1 + j\omega R \cdot \gamma\left[2C_d + \frac{n}{n+1} \cdot C_a\right]\right)}{(1 + j\omega 2 C_d R \cdot \gamma)^2} \qquad [11]$$

where $C_d$ is the diode capacitance, R is the diode resistance, y is an operation point factor, n is the number of diodes and $C_a$ is an adjustment capacitance. It turns out that adjustment is difficult in view of the fact that the product of diode capacitance and diode resistance, $C_d \cdot R$, is constant. While the preferred embodiment of the present invention has been herein described, numerous modifications, changes and improvements will occur to those skilled in the art without departing from the spirit and scope of the present invention.

We claim:

1. A current-to-voltage converter having low noise, a wide bandwidth, and a high dynamic range comprising:
   an input differential amplifier (8), said input differential amplifier being a cascode amplifier with an output connected to a current mirror (9);
   an operational amplifier (10,14) for providing an output voltage responsive to said current mirror (9);
   a current source (11), said current source being connected to a current supply input to said input differential amplifier (8);
   a high valued measuring resistance (R15, 35) being encased by a first casing (C5, 35) said first casing (C5, 35) being a first shield, said high valued measuring resistance (R15, 35) being electrically located in a feedback loop in said input differential amplifier;
   said input differential amplifier (8) being encased by a second casing (15, 25), said second casing being a second shield and being connected to said first shield; and
   whereby a measured current through said high valued measuring resistance such that said measured current can be determined from said voltage drop.

2. The current-to-voltage converter in accordance with claim 1 wherein said measuring resistance is an ohmic resistor (R15) having a value between 1 and 100 GΩ and is connected in parallel with a capacitor (C5), such that the feedback loop (12) has a non-linear characteristic.

3. The current-to-voltage converter in claim 1 wherein said measuring resistance includes at least one diode (35) such that the feedback loop (12) has a non-linear characteristic.

4. The current-to-voltage converter in claim 3, wherein said measuring resistance is a chain of diodes in antiparallel connection.

5. The current-to-voltage converter in claim 3, wherein said measuring resistance is a chain (35) of pairs (36) of diodes in antiparallel connection.

6. The current-to-voltage converter in claim 1 wherein said measuring resistance is at least one transistor having a feedback loop (12) with a non-linear characteristic.

7. The current-to-voltage converter in claim 2, wherein said first casing (25) is a capacitor (C5) in parallel connection with said measuring resistance (R15, 35) and comprises a dielectric sleeve (18) having inner and outer metallizations (20, 21), the outer metallization being connected to an opening (22) in said second casing (15), and said measuring resistance (R15, 35) being arranged centrally inside said sleeve (18) with terminal being solidly soldered into a head portion (23) of said capacitor (C5), said head portion (23) being electrically connected to said inner metallization (20) of the capacitor (C5).

8. The current-to-voltage converter in claim 7, wherein the length, thickness and dielectric constant of said sleeve (18) of said parallel capacitor (C5) are such that its capacitance is between 1 nF and 10 nF.

9. The current-to-voltage converter in claim 1 wherein said feedback loop (12) further comprises: an adjustable resistor (R16) encapsulated within the said second casing (25); and a feedthrough (27), said adjustable resistor being coupled to said converter through said feedthrough.

10. The current-to-voltage converter in claim 1 wherein said input differential amplifier (8) further comprises a first pair of field-effect transistors (T1, T2) with their gate electrodes respectively being connected to the input terminals of the converter, with their source electrodes being commonly connected to said current source (11) at said current supply input and with their drain electrodes being individually connected to the source electrodes of a second pair of field-effect transistors (T3, T4) whose gate electrodes are commonly connected to said current source (11), drain electrodes of said second pair of field effect transistors being connected to said current mirror circuit (9).

11. The current-to-voltage converter in claim 1 wherein said current mirror circuit (9) comprises a first transistor (T5) with a base and a collector commonly connected to the output terminal of said differential amplifier (8) and to a base of a second transistor (T6), an output signal being provided to said operational amplifier (10) from said second transistor's collector, and the emitters of said first and second transistors (T5, T6) being connected to a power supply via their respective emitter resistors (R4, R5).

12. The current-to-voltage converter in claim 1 wherein said current mirror circuit (32) is a symmetrical arrangement of two branches, each said branch comprising:

a first transistor (T10, T12) with a base and collector commonly connected to an output terminal of said differential amplifier (8) and to a base of a second transistor;

said second transistor's collector providing an output signal said branch output signals being connected to a positive and a negative input, respectively, of said operational amplifier (10); and, the emitters of said first and second transistors being connected to a voltage supply through an emitter resistor.

13. The current-to-voltage converter in claim 8, wherein the length, thickness, and dielectric constant of said sleeve (18) of said parallel capacitor (C5) are such that its capacitance is essentially 4 nF.

* * * * *